United States Patent [19]

Goffe

[11] 4,029,502
[45] June 14, 1977

[54] IMAGING SYSTEM CONTAINING AGGLOMERABLE MATERIAL

[75] Inventor: William L. Goffe, Webster, N.Y.

[73] Assignee: Xerox Corporation, Stamford, Conn.

[22] Filed: Aug. 26, 1968

[21] Appl. No.: 755,306

[52] U.S. Cl. .................. 96/1 PS; 96/1 R; 96/27 R
[51] Int. Cl.² ................................. G03G 13/22
[58] Field of Search ............. 96/1, 1.1, 27, 75; 204/181

[56] References Cited

UNITED STATES PATENTS

| | | |
|---|---|---|
| 2,911,299 | 11/1959 | Baril, Jr. et al. .................. 96/49 |
| 3,238,041 | 3/1966 | Corrsin .................. 96/1 |
| 3,254,997 | 6/1966 | Schaffert .................. 96/1 |
| 3,291,601 | 12/1966 | Gaynor .................. 96/1.1 |

*Primary Examiner*—David Klein
*Assistant Examiner*—Judson R. Hightower
*Attorney, Agent, or Firm*—James J. Ralabate; Richard A. Tomlin; George J. Cannon

[57] ABSTRACT

An imaging system comprising providing an imaging member comprising an agglomerable layer contacting a softenable layer and imagewise softening said member to cause relative transparentizing of said member in softened areas due to an agglomeration of the agglomerable layer in softened portions of said member.

33 Claims, 4 Drawing Figures

INVENTOR.
WILLIAM L. GOFFE

BY

David C. Petrie

ATTORNEY

IMAGING SYSTEM CONTAINING AGGLOMERABLE MATERIAL

BACKGROUND OF THE INVENTION

This invention relates in general to imaging and more specifically to a new migration imaging system.

There has recently been developed a migration imaging system capable of producing high quality images of high density, continuous tone and high resolution wherein migration material is caused to imagewise migrate in depth in a softenable layer, in some embodiments to deposit in image configuration on a substrate. This system is described in detail, with references to related applications, in copending application Ser. No. 725,676, filed May 1, 1968, now abandoned.

This imagewise migration in depth imaging system, while extremely advantageous in terms of simplicity and the high quality of the resulting images, does generally employ, in many of its modes, a charging step or an electrostatic latent image and an electrically insulating softenable layer and a photoconductive migration layer.

SUMMARY OF THE INVENTION

It is an object of this invention to provide a mode of imaging, using imaging members similar to the type disclosed in aforementioned copending application Ser. No. 725,676, which eliminates the charging step and in some embodiments produces an image merely by exposure of the imaging member.

It is a further object of this invention to provide an imaging system which does not require an electrically insulating softenable layer.

It is a further object of this invention to provide an imaging system which does not require use of a charge photosensitive material.

BRIEF DESCRIPTION OF THE DRAWINGS

For a better understanding of the invention as well as other objects and further features thereof, reference is made to the following detailed disclosure of this invention taken in conjunction with the accompanying drawings wherein.

DESCRIPTION OF THE PREFERRED EMBODIMENTS

Figure 1:
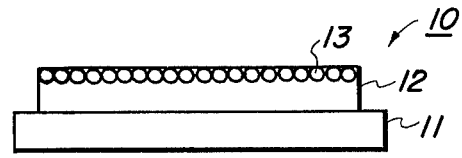
FIG. 1 represents a partially schematic drawing representing a preferred embodiment of an imaging member according to the invention.

Referring now to the Figures and in particular to FIG. 1, there is shown a schematic drawing of an example of one embodiment of an imaging member 10 according to this invention comprising substrate 11, softenable layer 12 which contains at its upper surface agglomerable layer 13 of particulate material.

Substrate 11 may be omitted in many imaging member embodiments of this invention where the softenable layer is self-supporting but may conveniently be included as a base for coating or otherwise forming many suitable materials for softenable layer 12. Any substrate with sufficient mechanical coherence and strength to support layers 12 and 13 may be used. Electrically insulating, conductive or semi-conductive materials may be used.

The substrate and member 10 may be in any suitable form such as a strip, sheet, plate, coil, cylinder, drum, endless belt, moebius strip and the like. If desired, the substrate may be substantially transparent to allow for agglomerating exposure of the member from the substrate side and to permit the resultant imaged member to be viewed in transmitted light, for example, to be used as a projection transparency.

Softenable layer 12 which may comprise one or more layers of softenable materials may be any suitable material, typically a plastic or thermoplastic material which is softenable either by the agglomerating radiation of this invention, by reason of contacting with a softening liquid, a softening vapor and combinations thereof and other suitable member 10 softening means to provide for the agglomerating effect and resultant transparentizing. "Softenable" as used herein to describe layer 12 is intended to mean any material which can be rendered more permeable to material or particles of layer 13 migrating substantially laterally through the bulk of layer 12. Softenable layer 12 may be electrically conductive, insulating or semi-conductive.

Typical substantially electrical insulating softenable materials include Staybelite Ester 10, a partially hydrogenated rosin ester, Foral Ester, a hydrogenated rosin triester, and Neolyne 23, an alkyd resin, all from Hercules Powder Co.; SR type silicone resins available from General Electric Corporation; Sucrose Benzoate, Eastman Chemical; Velsicol X-37, a polystyrene-olefin copolymer from Velsicol Chemical Corp.; Hydrogenated Piccopale 100, Piccopale H-2, highly branched polyolefins, Piccotex 100, a styrene-vinyl toluene copolymer, Piccolastic A-75, 100 and 125, all polystyrenes, Piccodiene 2215, a polystyrene-olefin copolymer, all from Pennsylvania Industrial Chemical Corp.; Araldite 6060 and 6071, epoxy resins from Ciba; R5061A, a phenylmethyl silicone resin, from Dow Corning; Epon 1001, a bisphenol A-epichlorohydrin epoxy resin, from Shell Chemical Corp.; and PS-2, PS-3, both polystyrenes, and ET-693, a phenolformaldehyde resin, from Dow Chemical; custom synthesized copolymers of styrene and hexylmethacrylate, a custom synthesized polydiphenylsiloxane; a custom synthesized polyadipate; acrylic resins available under the trademark Acryloid from Rohm & Haas Co., and available under the trademark Lucite from the E. I. DuPont de Nemours & Co.; thermoplastic resins available under the trademark Pliolite from the Goodyear Tire & Rubber Co.; a chlorinated hydrocarbon available under the trademark Aroclor from Monsanto Chemical Co.; thermoplastic polyvinyl resins available under the trademark Vinylite from Union Carbide Co.; other thermoplastics disclosed in Gunther et al U.S. Pat. 3,196,011; waxes and blends, mixtures and copolymers thereof.

Typical conductive softenable materials include Ethocel an ethyl cellulose material from Dow Chemical Co., polyxylene adipate, polyhexamethylene sebacate, polyvinyl alcohol, polyvinylbenzyltrimethyl ammonium chloride, and others.

The above group of materials is not intended to be limiting but merely illustrative of materials suitable for softenable layer 12. The softenable layer may be of any suitable thickness. The primary determination in this regard is that the thickness of softenable layer separating the agglomerable layer from the imagewise softening agent be sufficiently thin to permit sufficient softening radiation or other softening agent such as softening vapor or heat to permeate or be efffectively transferred by the softenable layer to the agglomerable layer to cause the imaging effect of this invention. In this regard, imaging members with softenable layer thicknesses of about 3 microns have been exposed, through the rear i.e., from the substrate 11 side, the substrate constituting an aluminized Mylar polyester terephthalate film where the aluminum layer was about 50% transmissive of visible light and the Mylar was about 3 mils thick, in the preferred infra red exposure softening embodiment hereof to cause the transperentizing imaging effect of this invention. Radiation exposure softening may take place through even thicker softenable layers especially where the material of the layer is not an effective absorber of that radiation being used.

The Figs. show the preferred positioning of layer 13 relative to softenable layer 12, where layer 13 is embedded in the softenable layer 12 but spaced apart from any substrate 11. This imaging member makeup provides for optimum imaging efficiency. However, imaging according to this invention can be done with agglomerable layer 13 actually touching the softenable layer 12-substrate 11 interface. Thus, layer 13 may be located at any place in layer 12.

Layer 13 may comprise any suitable agglomerable material including electrical insulators, electrical conductors, photoconductive materials and non-photoconductive materials.

Agglomerate and the several variant forms thereof used herein defines the effect of substantial massing or fusing together of the imagewise softened portions of layer 13 to greatly reduce the cross-sectional area and transparentize or effect a color change of layer 13 in said areas, the color change associated with the light scattering caused, for example, by the particles in the imaged areas of a particle layer 13 (see copending application Ser. No. 725,676), which may be accompanied by some dispersing of individual portions or particles of layer 13 in depth in layer 12 which produce additional transparentizing and color changes; specifically including the massing together of closely packed particles into a smaller number of larger spheres of less total surface area.

In fact, greater sensitivities may be obtained for color changes as opposed to a change to near neutral density. For example, an image which is very pronouncedly different from the color of the background (for example the purple image in a yellow-orange background of Example VII) may give substantially greater contrast density for the same radiation exposure than a change to a near neutral density in a yellow-orange background.

Preferred agglomerable materials for use herein, because of the excellent quality of the resultant images and because of the sensitivity of the system include: crystalline selenium, amorphous selenium, amorphous selenium alloyed with arsenic, tellurium, antimony, bismuth, etc.; amorphous selenium or its alloys doped with halogens; tellurium and mixtures of amorphous selenium and one or more crystalline forms of selenium including the monoclinic and hexagonal forms. An optimum agglomerable material comprises predominantly, greater than 50% by weight, amorphous selenium.

It is found that especially suitable materials for layer 13 especially in the preferred radiation exposure mode hereof, have a low glass transition temperature i.e., generally below about 50° or 60° C. and a high absorption coefficient in the visible, such as selenium.

Any suitable agglomerable material may be used in layer 13. Typical additional agglomerable materials include sulfur, dyed polyvinyl carbazole and others.

Agglomerable layers 13, portions of which laterally migrate during imagewise softening, is shown to be a microscopically discontinuous layer of closely packed particles. It is preferred for images of highest resolution, density and utility and to provide for the most sensitive layer system that layer 13 be a microscopically discontinuous layer and optimally that the layer 13 be particulate in order to best promote the agglomerating effect of this invention. However, layer 13 taking the form of a Swiss cheese pattern or even a completely continuous thin layer will work.

For optimum results layer 13 is preferably from about 0.1 to about 1 micron thick although about 0.05 to about 5 micron layers have been found to give images according to this invention.

Optimum layers in this regard are thin, optimally between about 0.1 and about 0.5 micron thick microscopically discontinuous layers comprising predominantly amorphous selenium, for example, vacuum evaporated by techniques as disclosed in copending application Ser. No. 423,167, filed Jan. 4, 1965. Microscopically discontinuous layer 13 may also be formed by other methods such as cascading, dusting, etc. as shown in copending application Ser. No. 460,377, filed June 1, 1965 now U.S. Pat. No. 3,520,681 or by stripping and other methods as described in copending application Ser. No. 685,536, filed Nov. 24, 1967, now abandoned, or any other suitable method. If thicker coatings are desired, layer 12 may be softened slightly by heating, for example, to permit particles deposited on its surface to seat themselves, i.e., to sink a short distance into the plastic after which additional particles may be cascaded across or dusted over the softenable layer 12.

Especially suitable selenium films when viewed under a microscope show either a network of cracks or apertures or else a network of dark lines indicating a microscopically discontinuous layer. Electron micrographs show that optimum predominantly amorphous selenium films are actually composed of discrete spherical amorphous particles of an average particle size preferably between about 0.1 and about 0.5 microns.

While the layered configuration as described and illustrated is preferred, the binder structure where agglomerable particles are dispersed in the softenable layer may also be used and is specifically intended to be included in the claim language "an imaging member comprising an agglomerable layer contacting a softenable layer". Preferred particle/binder ratios are found to be between about 1/1 and about 1/3 and preferred binder layer thicknesses are generally less than about 5 microns since contrast density falls off for thicker layers. It will be appreciated that the binder layer may be placed on a softenable layer or sandwiched between softenable layers to create an imaging member much thicker than the 5 micron maximum which is preferred for the binder part of the overall structure. Further information on the makeup of binder layers for use herein is found in copending application Ser. No. 634,757, filed Apr. 28, 1967, now abandoned.

The imaging members hereof are imaged by image softening by imagewise heat softening preferably by softening radiation, contacting with a softening liquid or vapor, heat and combinations thereof and other suitable member 10 softening means.

Figure 2:
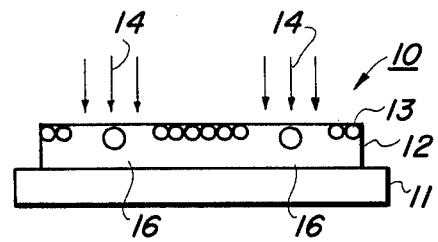
FIG. 2 shows the imaging member of FIG. 1 being imaged in a preferred mode hereof by reason of exposure to agglomerating softening radiation.

Referring now to FIG. 2, the preferred mode of imagewise softening, because of its simplicity and because of the good images produced, comprises exposing the members hereof to an image pattern of softening radiation 14 preferably infra red radiation, such as radiation of a wavelength between about 7,000 and 50,000 angstrom units, typically by any suitable conventional projection technique. However, while infra red radiation is preferred, inter alia, because of its heating efficiency, visible radiation, such as radiation of a wavelength between about 4,000 and 7,000 angstrom units, and even shorter wavelength radiation (which will typically have to be of higher intensity to produce the heating and softening agglomerating effect hereof), such as from a laser can be used as an agglomerating radiation herein. It has been found preferred to keep the viscosity of the softenable layer 12 during exposure between about $10^4$ and $10^3$ poises. Suitable viscosities may be inherent in certain softenable layers depending on the material used and its shelf life. A pre-exposure uniform softening step for example by exposing the member to a softening vapor or heat may be desirable in certain instances to bring the viscosity of the softenable layer, layer 13 or both into the preferred range. This pre-exposure softening step brings the member and specifically layer 13 closer to the point of agglomeration so that sensitivity is improved. This uniform softening step may also be initiated during or after imagewise softening and may be by the same means i.e., heat, vapor, liquid or by different means, such as heat for image softening and vapor for uniform softening.

It is seen that agglomeration causes reduction of surface area of layer 13 by the formation of larger spheres 16 of the same mass as the total mass of the agglormerated smaller particles of layer 13 but with a smaller surface area than the total of the surface areas of the agglomerated smaller particles.

Since it is thought that the agglomeration hereof is typically accompanied by at least some softening of both layers 12 and 13 to allow the particles to drift together, wet each other, and permit the reduction of surface area of the material comprising layer 13, there are several process variations of imaging. Typical combinations are a. uniform softening of layer 12 by vapor with no softening of layer 13, with imagewise softening of layer 13 by heating which additionally softens layer 12 in the image areas;

b. uniform softening of only layer 12 by heating and imagewise softening of layer 13 by vapor; and c. uniform softening of only layer 13 by vapor and imagewise softening of layer 12 by heating.

In this preferred agglomeration by radiation embodiment the agglomerating effect may result from radiation absorption by substrate 11, layer 12, layer 13 or combinations thereof. For example, substrate 11 may be exposed with conduction and convection transferring the heat to layers 12 and 13 to cause the agglomerating effect hereof.

Infra red irradiation greater than about 0.2 watts/-square mm. have been found to produce acceptable quality images. Image resolution is limited by spreading of heat. It is desirable therefore to raise the temperature in the region of layer 13 quickly and to rapidly cool so that lateral spreading of heat and draining away of heat by layers 12 and 11 is minimized. Since this condition is satisfied by high radiant flux/unit area, high radiant flux/unit area for short times are preferred for maximum resolution. The shortest exposure times are limited by the time required for layer 13 to agglomerate which can be less than 1/1,000 of a second.

Figure 3:
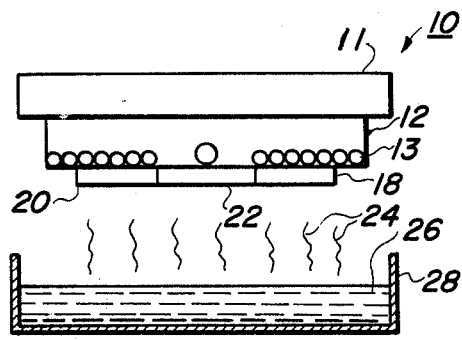
FIG. 3 shows the imaging member of FIG. 1 being imagewise softened by exposure to a softening vapor applied through a mask.

Referring now to FIG. 3, mask 18 with open portions 22 and mask portions 20 is contacted to layer 13 and then member 10 is exposed in an area corresponding to open portion 22 to the vapors 24 of a solvent 26 in container 28 to cause imagewise agglomeration and transparentization in the softened areas.

Figure 4:
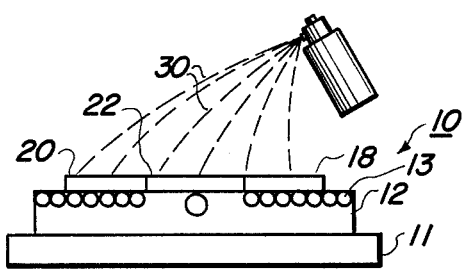
FIG. 4 shows the imaging member of FIG. 1 being imagewise softened by exposure to a softening liquid applied through a mask.

FIG. 4 shows a liquid in the form of a spray 30 being applied through mask 18 in image configuration to contact and soften layers 12 and 13.

The following Examples further specifically define the present invention with respect to the imaging system of this invention. The parts and percentages are by weight unless otherwise indicated. The Examples below are intended to illustrate various preferred embodiments of the imagewise softening and imagewise exposure imaging system of this invention.

EXAMPLE I

An imaging member such as that illustrated in FIG. 1 is prepared by first dissolving about 5 parts of Staybelite Ester 10 in about 20 parts of cyclohexanone and about 75 parts toluene. Using a gravure roller the solution is then roll coated onto about a 3 mil Mylar polyester film having a thin semi-transparent aluminum overcoating, the aluminum about 50% visible light transmissive. The coating is applied so that when air dried for about 2 hours to allow for evaporation of the cyclohexanone and toluene solvent, about a 2 micron layer of Staybelite ester is formed on the aluminized Mylar. A thin layer of particular vitreous selenium approximately 0.5 microns in thickness is then deposited over the Staybelite surface by vacuum deposition utilizing the process set forth in copending patent application Ser. No. 423,167, filed Jan. 4, 1967.

The softenable layer is pre-softened by exposing it to the vapors of 1,1,1-trichloroethane emanating from a small mouthed gallon jug with the bottom covered with solvent for about 5 seconds. In the step operation of this Example, as an aid in standardizing the viscosity of the pre-softened member, there should be about a 2 to 30 second delay between the end of this pre-softening step and the start of the imagewise exposure step in order to imagewise radiate when the viscosity of the presoftened member is stabilized.

An imagewise mask is laid on the selenium surface and exposed for about 5 seconds to a 20 watt tungsten microscope light 2 inches away and focused to a spot 80 square millimeters in area.

An image is produced with agglomeration and transparentizing taking place in the open mask radiation struck areas of the imaging member. The resolution is about 3 line pairs/millimeter with a contrast density of about 0.4.

EXAMPLES II & III

Example I is followed except that exposure takes place through a positive and a negative projection transparency, respectively.

EXAMPLE IV

An imaging member is provided as in Example I except that the Staybelite is replaced by a custom synthesized copolymer of styrene and hexylmethacrylate coated onto the substrate out of a toluene solution.

The softenable layer is pre-softened as in Example I except that 1,1,1-trichloroethane is replaced by methylene chloride.

The member is exposed as in Example I with similar results.

EXAMPLE V

An imaging member as in Example IV is pre-softened as in Example IV.

Imagewise softening is accomplished by heating a pair of bars resting on layer 13 to about 110° C. for about 3 second.

An image of the bars results with the imaging member being transparent in the heated areas. Under a microscope it is seen that agglomeration in the bar heated areas has caused groups of 2 or 3 particles of the original particulate selenium layer to fuse into separate spheres.

EXAMPLE VI

An imaging member as in Example IV is pre-softened as in Example I.

Imagewise exposure is the same as in Example I but the time of the exposure is about 20 seconds.

The resultant image is similar to that of Example I but resolution has fallen off to about 1 line pair/millimeter.

EXAMPLE VII

A yellow-orange appearing imaging member as in Example IV is pre-softened as in Example IV.

From about 10 to 60 seconds after the pre-softening, the member is placed on a microscope stand and illuminated from both sides, broadly illuminated from the top and illuminated from the bottom with about a 0.2 millimeter diameter spot moving at about 1 millimeter/second to give about a 0.2 second exposure.

The imaged member appears as a purple line trace about 0.145 mm wide in a background of yellow-orange.

EXAMPLE VIII

An imaging member as in Example VII is pre-softened and imagewise exposed in Example VII except that the imaging spot is about 0.45 mm in diameter.

The imaged member appears as a light blue line trace about 0.43 mm wide, with a contrast density in blue light of about 1.0, in a yellow-orange background.

EXAMPLE IX

An imaging member as in Example IV is imagewise softened with methylene chloride vapor as in Example IV, but through a mask resting on the surface of layer 13 to create the image pattern of vapor.

The member is then uniformly heated to about 110° C. for about 3 seconds on a hot plate.

An imaged member results of a resolution about 3 line pairs/mm with transparent areas in the areas previously exposed to the vapor.

Although specific components and proportions have been stated in the above description of preferred embodiments of the imaging system of this invention, other suitable materials as listed herein may be used with similar results. In addition other materials may be added to the materials used herein and variations may be made in the various processing steps to synergize, enhance or otherwise modify the properties of this invention. For example, particles of the agglomeration layer 13 may consist of more than one particle, for example, coloring material such as dyes or pigments in a resin binder. Also, although the material of layer 13 is opaque in many embodiments, it need not be opaque. Clear or colorless material may still show a substantially reduced projection light scattering effect in agglomerated areas to produce satisfactory transparencies according to the invention. Also, although agglomeration has been spoken of as producing its most prominent transparentizing effect, the imagewise agglomeration hereof may produce a variety of color changes in a member which can then be directly observed or used as a projection transparency; and transparentizing and the variant forms thereof used herein is specifically intended to include these color changes.

Temporary softening as opposed to irreversible softening is sufficient to cause agglomeration hereof and is usually preferred to provide a self-fixing mechanism. Hard overcoatings and other fixing techniques will occur to those skilled in the art.

It will be appreciated that when a substrate 11 is used, it may be a substantial absorber of heating radiation and cause indirect heating of layer 13 and softenable material by convection and conduction from the substrate.

It will be understood that various other changes in the details, materials, steps and arrangmements of parts which have been herein described and illustrated in order to explain the nature of the invention will occur to and may be made by those skilled in the art upon a reading of this disclosure and such changes are intended to be included within the principle and scope of this invention.

What is claimed is:
1. An imaging method comprising the steps of:
   a. providing an imaging member comprising a nongaseous agglomerable layer contacting a softenable layer, said softenable layer or said agglomerable layer capable of being softened pursuant to the imagewise softening step below; and
   b. imagewise softening said softenable layer or said agglomerable layer or both to cause agglomeration of nongaseous portions of said agglomerable layer in said imagewise softened areas of said member whereby said member in said imagewise softened areas is made more transparent compared to nonimagewise softened areas of said member.
2. An imaging method according to claim 1 wherein said imagewise softening is at least partially accomplished by imagewise exposing the member to softening radiation.
3. An imaging method according to claim 2 wherein said softening radiation is infra red radiation.
4. An imaging method according to claim 2 wherein said softening radiation is visible radiation.
5. An imaging method according to claim 2 wherein the member is also softened by substantially uniform exposure to softening vapors.
6. An imaging method according to claim 5 wherein said uniform vapor softening occurs prior to or during the softening radiation step.

7. An imaging method according to claim 1 wherein said agglomerable layer is between about 0.05 and about 5 microns thick.

8. An imaging method according to claim 7 wherein said agglomerable layer is between about 0.1 and about 1 micron thick.

9. An imaging method according to claim 7 wherein said agglomerable layer is a microscopically discontinuous layer.

10. An imaging method according to claim 9 wherein said microscopically discontinuous agglomerable layer is composed of closely packed particles.

11. An imaging method according to claim 7 wherein said agglomerable layer comprises predominantly amorphous selenium.

12. An imaging method according to claim 10 wherein said agglomerable layer comprises predominantly amorphous selenium.

13. An imaging method according to claim 12 wherein the average diameter of said particles is between about 0.1 and about 0.5 microns.

14. An imaging method according to claim 1 wherein said member comprises agglomerable particles dispersed in said softenable layer.

15. An imaging method according to claim 14 wherein the weight ratio of particles to softenable layer material is between about 1/1 and 1/3.

16. An imaging method according to claim 15 wherein the softenable layer is less than about 5 microns thick.

17. An imaging method according to claim 1 wherein said agglomerable layer comprises selenium.

18. An imaging method according to claim 17 wherein said agglomerable layer comprises amorphous selenium.

19. An imaging method according to claim 18 wherein said agglomerable layer comprises predominantly amorphous selenium.

20. An imaging method according to claim 1 wherein said imagewise softening is at least partially accomplished by imagewise exposing said member to softening vapors.

21. An imaging method according to claim 1 wherein imagewise softening is at least partially accomplished by exposing said member to a softening liquid.

22. An imaging method according to claim 20 wherein said agglomerable layer is not separated from said vapors by more than about 1 micron of softenable layer.

23. An imaging method according to claim 21 wherein said agglomerable layer is not separated from said liquid by more than about 1 micron of softenable layer.

24. An imaging method according to claim 2 wherein said agglomerable layer is between about 0.05 and about 5 microns thick, is microscopically discontinuous and comprises predominantly amorphous selenium.

25. An imaging method according to claim 5 wherein said agglomerable layer is between about 0.05 and about 5 microns thick, is microscopically discontinuous and comprises predominantly amorphous selenium.

26. An imaging method according to claim 2 wherein the viscosity of said softenable layer is between about $10^4$ and $10^3$ poises during said imagewise radiation exposure.

27. An imaging method according to claim 1 wherein said softenable layer overlies a substrate and said agglomerable layer is at least embedded in said softenable layer.

28. An imaging method according to claim 27 wherein said agglomerable layer is spaced apart from said substrate.

29. An imaging method according to claim 24 wherein said softenable layer overlies a substrate and said agglomerable layer is at least embedded in said softenable layer.

30. An imaging method according to claim 29 wherein said member is imagewise exposed from the substrate side.

31. An imaging method according to claim 2 wherein the member is also substantially uniformly softened.

32. An imaging method according to claim 31 wherein said agglomerable layer is between about 0.05 and about 5 microns thick, is microscopically discontinuous and comprises predominantly amorphous selenium.

33. An imaging method according to claim 32 wherein the viscosity of said softenable layer is between about $10^4$ and $10^3$ poises during said imagewise radiation exposure.

* * * * *